(12) United States Patent
Nakao

(10) Patent No.: US 7,768,109 B2
(45) Date of Patent: Aug. 3, 2010

(54) SEMICONDUCTOR DEVICE AND METHOD OF MANUFACTURING THE SAME

(75) Inventor: Junichi Nakao, Ibo-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 12/191,494

(22) Filed: Aug. 14, 2008

(65) Prior Publication Data

US 2009/0050957 A1 Feb. 26, 2009

(30) Foreign Application Priority Data

Aug. 24, 2007 (JP) ............................ P2007-218184

(51) Int. Cl.
*H01L 23/02* (2006.01)
(52) U.S. Cl. ...................... 257/678; 257/328; 257/666; 257/787; 257/E21.001
(58) Field of Classification Search .................. 257/328, 257/666, 678, 787, E21.001
See application file for complete search history.

(56) References Cited

U.S. PATENT DOCUMENTS

| 4,731,644 | A | 3/1988 | Neidig |
| 5,243,223 | A | 9/1993 | Yamada et al. |
| 6,201,696 | B1 * | 3/2001 | Shimizu et al. ............. 361/704 |
| 6,215,185 | B1 | 4/2001 | Kikuchi et al. |
| 2004/0140116 | A1 * | 7/2004 | Bayerer et al. ............. 174/52.2 |
| 2007/0290305 | A1 | 12/2007 | Oyama et al. |

FOREIGN PATENT DOCUMENTS

| JP | 3-34355 | 2/1991 |
| JP | 4-321259 | 11/1992 |
| JP | 6-89946 | 3/1994 |

* cited by examiner

*Primary Examiner*—Tan N Tran
(74) *Attorney, Agent, or Firm*—Oblon, Spivak, McClelland, Maier & Neustadt, L.L.P.

(57) ABSTRACT

A semiconductor device 1 has a metallic base substrate 2 for heat-dissipating, a wiring board 3, a MOSFET 4 as a semiconductor element, externally leading terminals 5A, 5B, 5C, a casing 6 formed of a synthetic resin, a fixing resin 7, and a gel-like resin layer 8. On the metallic base substrate 2, the casing 6 is disposed to surround one ends of the externally leading terminals 5A, 5B, 5C and the MOSFET 4. The other ends of the externally leading terminals 5A, 5B, 5C are externally protruded from the casing 6, and terminal body portions 51A, 51B, 51C for coupling them are inserted in through hole portions 61A, 61B, 61c of the casing 6. The terminal body portions 51A, 51B, 51C and the through hole portions 61A, 61B, 61c are fixed with the fixing resin 7, and the gel-like resin layer 8 is formed at the lower part of the casing 6. A space 9 is formed between the gel-like resin layer 8 and the casing 6.

12 Claims, 5 Drawing Sheets

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2007-218184, filed on Aug. 24, 2007; the entire contents of which are incorporated herein by reference.

BACKGROUND OF THE INVENTION

1. Field of the Invention

The present invention relates to a semiconductor device provided with a power semiconductor element and its production method.

2. Description of the Related Art

For example, a semiconductor device having a power semiconductor element such as a MOSFET (Metal Oxide Semiconductor Field Effect Transistor) is known to have a structure that a wiring board on which a semiconductor element is mounted is fixed to a metallic base substrate for heat-dissipating, and the periphery of the semiconductor element is covered with a frame. A gel-like resin layer is formed on a lower area within the frame, and a sealing resin layer is formed on the gel-like resin layer. One end of an externally leading terminal is connected to the wiring board, and the other end of the terminal is externally protruded through the gel-like resin layer and the sealing resin layer.

But, such a semiconductor device has a tendency that the gel-like resin layer charged into the frame is expanded with heat generated from the semiconductor element. With the expansion of the gel-like resin layer, a force of pulling upward is applied to the externally leading terminal, and a crack is easily produced in a joint portion for joining the wiring board and the externally leading terminal.

There is proposed a structure that a space is formed above the gel-like resin layer (e.g., JP-A 6-89946(KOKAI)). According to this structure, when the gel-like resin layer is thermally expanded, the expansion can be absorbed by the space, and a tensile stress applied to the externally leading terminal can be eased.

But, when the device is used with a bus bar connected to an end of the externally leading terminal which is externally protruded, vibrations transmitted from the bus bar to the externally leading terminal have a tendency to cause a crack in the joint between the wiring board and the externally leading terminal, or decreases a joint strength. As a result, the externally leading terminal is easily peeled from the wiring board, and the electrical connection between the externally leading terminal and the wiring board is degraded, resulting that the semiconductor device malfunctions.

SUMMARY OF THE INVENTION

A semiconductor device according to an aspect of the present invention comprises a metallic base substrate; a wiring board arranged on the metallic base substrate; a semiconductor element arranged on the wiring board; externally leading terminals having a first end which is arranged on the wiring board and electrically connected to the semiconductor element, a second end which is arranged outside of the wiring board, and a main body portion which couples/connects the first end and the second end; a housing which has a through portion, through which the main body portion of the externally leading terminal is inserted, and is disposed on the metallic base substrate to cover the first end of the externally leading terminal and the semiconductor element; a fixing resin for fixing the main body portion of the externally leading terminal to the through portion of the housing; and a gel-like resin layer which is formed within the housing to cover the first end of the externally leading terminal and the semiconductor element and to have a space between the gel-like resin layer and the housing.

A method of manufacturing a semiconductor device according to an aspect of the present invention comprises arranging a first end of externally leading terminal having the first end, second end and main body portion for coupling/connecting these ends, and a semiconductor element on a first main surface of a wiring board; arranging a metallic base substrate on a second main surface of the wiring board; inserting the main body portion of the externally leading terminal a through portion of a housing, arranging the housing to surround the first end of the externally leading terminal and the semiconductor element, and fixing the housing to the metallic base substrate; forming a gel-like resin layer within the housing to cover the first end of the externally leading terminal and the semiconductor element, and forming a space between the gel-like resin layer and the housing; and fixing the main body portion of the externally leading terminal to the through portion of the housing with a fixing resin.

DETAILED DESCRIPTION OF THE INVENTION

Hereinafter, embodiments for implementing the present invention will be described. Note that the embodiments will be explained in the following description with reference to the drawings, which are presented for purpose of understanding but not intended to limit the present invention.

Figure 1:
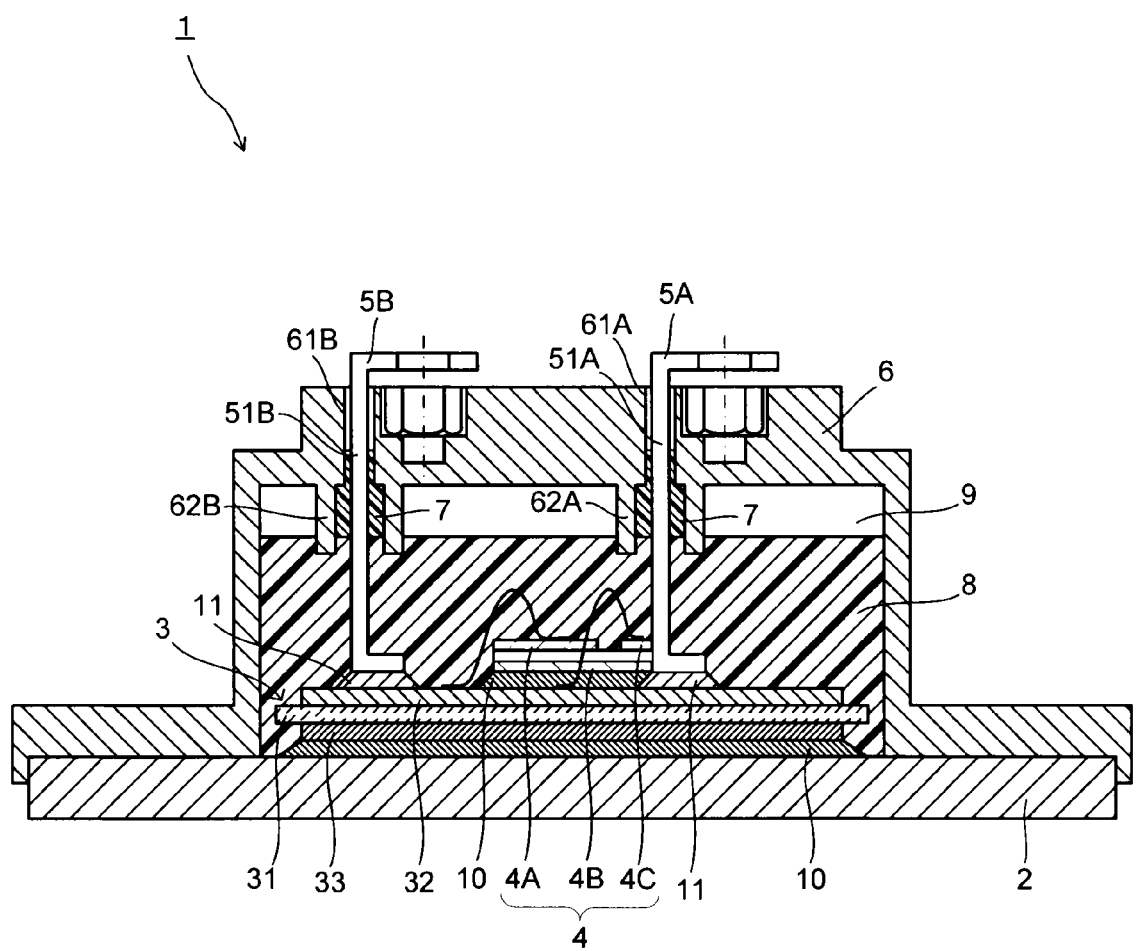
FIG. 1 is a cross-sectional view schematically showing a structure of a semiconductor device according to a first embodiment of the present invention.
Figure 2:
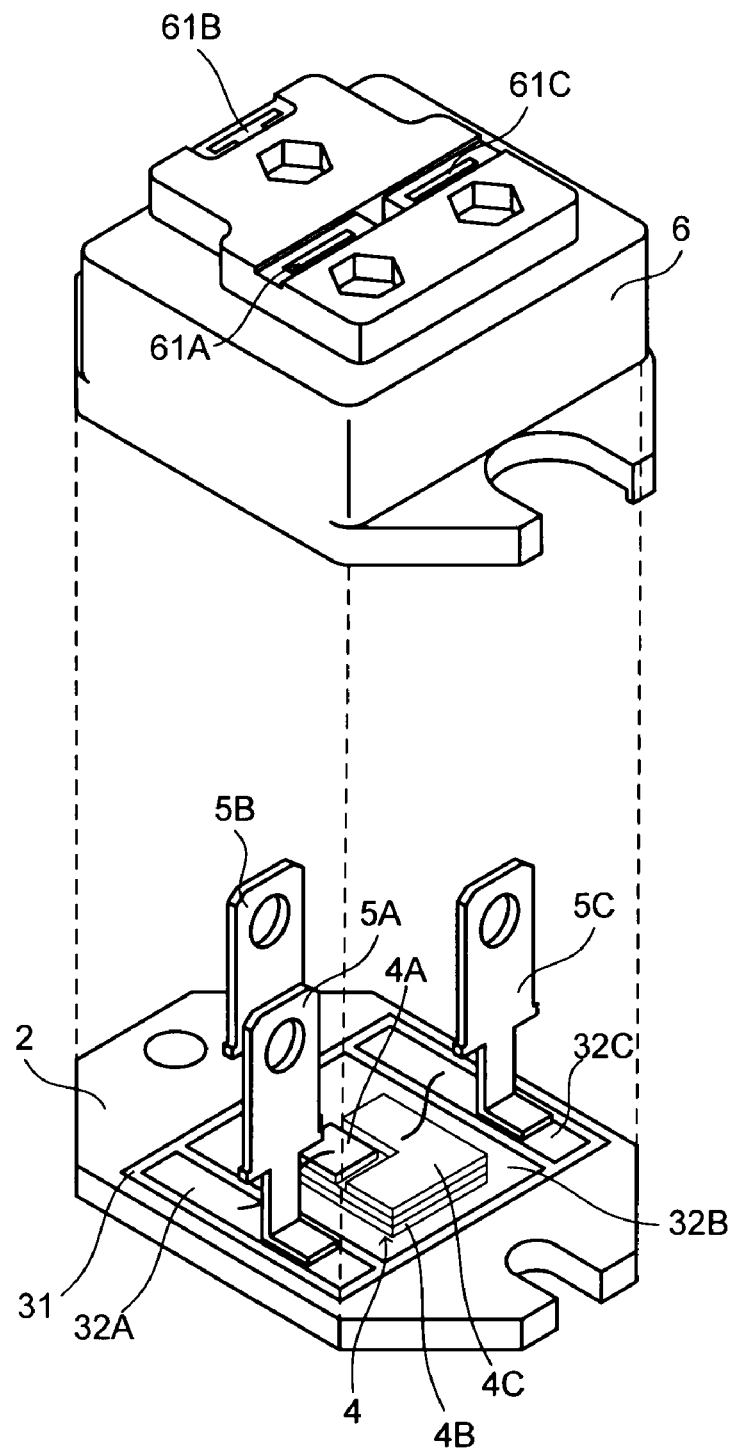
FIG. 2 is an exploded perspective view of the semiconductor device according to the first embodiment.
Figure 3:
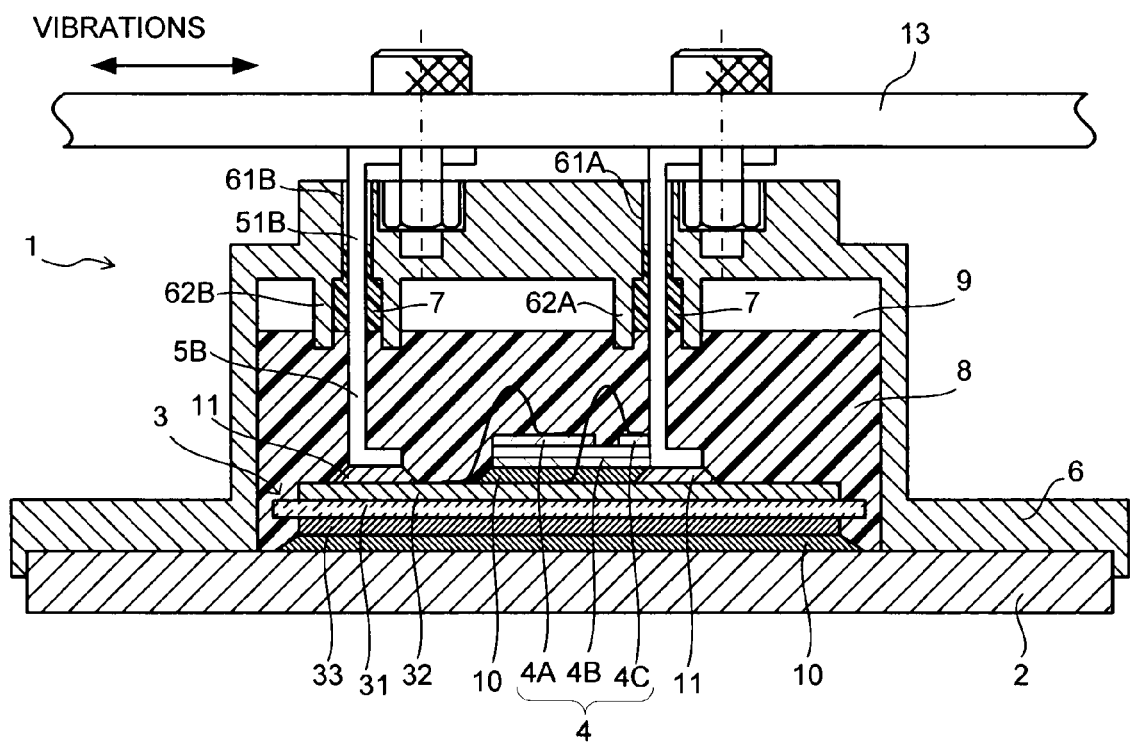
FIG. 3 is a cross-sectional view showing a structure that a bus bar is connected to the semiconductor device according to the first embodiment.

FIG. 1 is a cross-sectional view schematically showing a structure of a semiconductor device according to a first embodiment of the present invention. FIG. 2 is an exploded perspective view showing a structure of the semiconductor device shown in FIG. 1 excluding a gel-like resin layer. FIG. 3 is a cross-sectional view showing a structure that a bus bar is connected to the externally leading terminals of the semiconductor device shown in FIG. 1.

A semiconductor device 1 of the first embodiment has a metallic base substrate 2 for heat-dissipating, a wiring board 3, a MOSFET 4 as a semiconductor element, externally leading terminals 5A, 5B, 5C, a casing 6 of a synthetic resin, a fixing resin 7, and a gel-like resin layer 8. A semiconductor device having a vertical power MOSFET as an example of a semiconductor element is described in this embodiment. The MOSFET 4 has a gate electrode 4A and a source electrode 4C on its front surface and a drain electrode 4B on its back surface.

The metallic base substrate 2 is comprised of a metallic material (e.g., Al, Cu or the like) having good thermal conductivity and used as a plate for heat-dissipation of heat generated from the MOSFET 4. A wiring board 3 is joined to the metallic base substrate 2 with a conductive bonding material 10. As the conductive bonding material 10, a solder is used in this embodiment, and a thermosetting resin (e.g., an epoxy resin or a silicone resin) containing silver powder can also be used. The conductive bonding material 10 interposed between the metallic base substrate 2 and the wiring board 3 preferably has a thickness in a range of 10 to 100 μm.

The wiring board 3 has a structure that a wiring pattern 32 comprised of Cu or the like is formed on a first main surface (top surface in FIG. 1, FIG. 3) of an insulating substrate such as a ceramic substrate 31. And, a metallic film 33 (e.g., Cu or the like) is formed on a second main surface (the bottom surface in FIG. 1, FIG. 3) of the wiring board 3 to efficiently conduct heat generated from the MOSFET 4 toward the metallic base substrate 2.

As shown in FIG. 2, the wiring pattern 32 is composed of a gate wiring pattern 32A corresponding to the gate electrode 4A of the MOSFET 4, a drain wiring pattern 32B corresponding to the drain electrode 4B, and a source wiring pattern 32C corresponding to the source electrode 4C. The drain electrode 4B of the MOSFET 4 is disposed on the drain wiring pattern 32B of the wiring board 3, and the drain electrode 4B and the drain wiring pattern 32B are bonded with the conductive bonding material 10. The gate electrode 4A formed on the surface of the MOSFET 4 is connected (wire bonded) to the gate wiring pattern 32A through a bonding wire, and the source electrode 4C of the MOSFET 4 is wire bonded to the source wiring pattern 32C.

One end (first end) of each of the externally leading terminals 5A, 5B, 5C for gate, drain and source is arranged on the wiring pattern 32 and joined with a conductive bonding material (a solder in this embodiment). These joints (joints between the wiring pattern 32 and the first ends of the externally leading terminals 5A, 5B, 5C) comprised of the conductive bonding material are denoted by reference numeral 11. In other words, the first end of the externally leading terminal 5A for gate is arranged on the gate wiring pattern 32A and joined by the joint 11 comprised of the conductive bonding material, and the first end of the externally leading terminal 5B for drain is arranged on the drain wiring pattern 32B and joined by the joint 11 comprised of the conductive bonding material. The first end of the externally leading terminal 5C for source is arranged on the source wiring pattern 32C and joined by the joint 11 comprised of the conductive bonding material. Thus, the first end of the externally leading terminal 5A for gate is electrically connected with the gate electrode 4A of the MOSFET 4, and the first end of the externally leading terminal 5B for drain is electrically connected with the drain electrode 4B of the MOSFET 4. And, the first end of the externally leading terminal 5C for source is electrically connected with the source electrode 4C of the MOSFET 4.

The other end (second end) of each of the externally leading terminals 5A, 5B, 5C for gate, drain and source is positioned outside of the wiring board 3 and arranged to protrude externally from the casing 6. And, terminal body portions 51A, 51B, 51C connecting the first end and the second end are disposed through hole portions 61A, 61B, 61C for gate, drain and source formed in the casing 6. The terminal body portion 51C of the externally leading terminal 5C for source is not shown in FIG. 1 and FIG. 3 but has the same structure as that of the terminal body portion 51A of the externally leading terminal 5A for gate and the terminal body portion 51B of the externally leading terminal 5B for drain.

The second ends of the externally leading terminals 5A, 5B, 5C for gate, drain and source externally protruded from the casing 6 are connected to a bus bar 13 when the semiconductor device 1 is used. The fixing resin 7 is provided between the through hole portions 61A, 61B, 61C for gate, drain and source of the casing 6 and the terminal body portions 51A, 51B, 51C of the externally leading terminals 5A, 5B, 5C for gate, drain and source.

The fixing resin 7 firmly fixes the terminal body portions 51A, 51B, 51C of the externally leading terminals 5A, 5B, 5C for gate, drain and source and the through hole portions 61A, 61B, 61C for gate, drain and source of the casing 6. When the bus bar 13 is connected to the second ends of the externally leading terminals 5A, 5B, 5C for gate, drain and source as shown in FIG. 3, even if the externally leading terminals 5A, 5B, 5C for gate, drain and source are vibrated, a crack doesn't occur in the joints 11 between the first ends of the externally leading terminals 5A, 5B, 5C and the wiring board 3, and the joint strength can be prevented from lowering. The fixing resin 7 is not limited to a particular type of synthetic resin if it can firmly fix the terminal body portions 51A, 51B, 51C of the externally leading terminals 5A, 5B, 5C to the through hole portions 61A, 61B, 61C of the casing 6. For example, a thermosetting resin such as an epoxy resin, a silicone resin or the like can be used, and the epoxy resin is more preferably used.

The casing 6 is a housing whose bottom is not closed and disposed to surround the joints 11 between the wiring board 3 and the first ends of the externally leading terminals 5A, 5B, 5C, and the MOSFET 4. The lower end of the casing 6 is disposed on the metallic base substrate 2 by, for example, fixing. The casing 6 has a square rod shape in this embodiment and its shape is not limited to a particular one and may have a cylindrical shape or a dome shape. The casing 6 is formed to have a desired shape by injection molding of a synthetic resin. On the top surface of the casing 6 are formed the through hole portions 61A, 61B, 61C in which the terminal body portions 51A, 51B, 51C of the externally leading terminals 5A, 5B, 5C for gate, drain and source are inserted and held. The individual through hole portions 61A, 61B, 61C have cylindrical protruded portions 62A, 62B, 62C which are open downwardly. The cylindrical protruded portion 62C is not shown in FIG. 1 and FIG. 3 but has the same structure as the protruded portions 62A, 62B.

Figure 4:
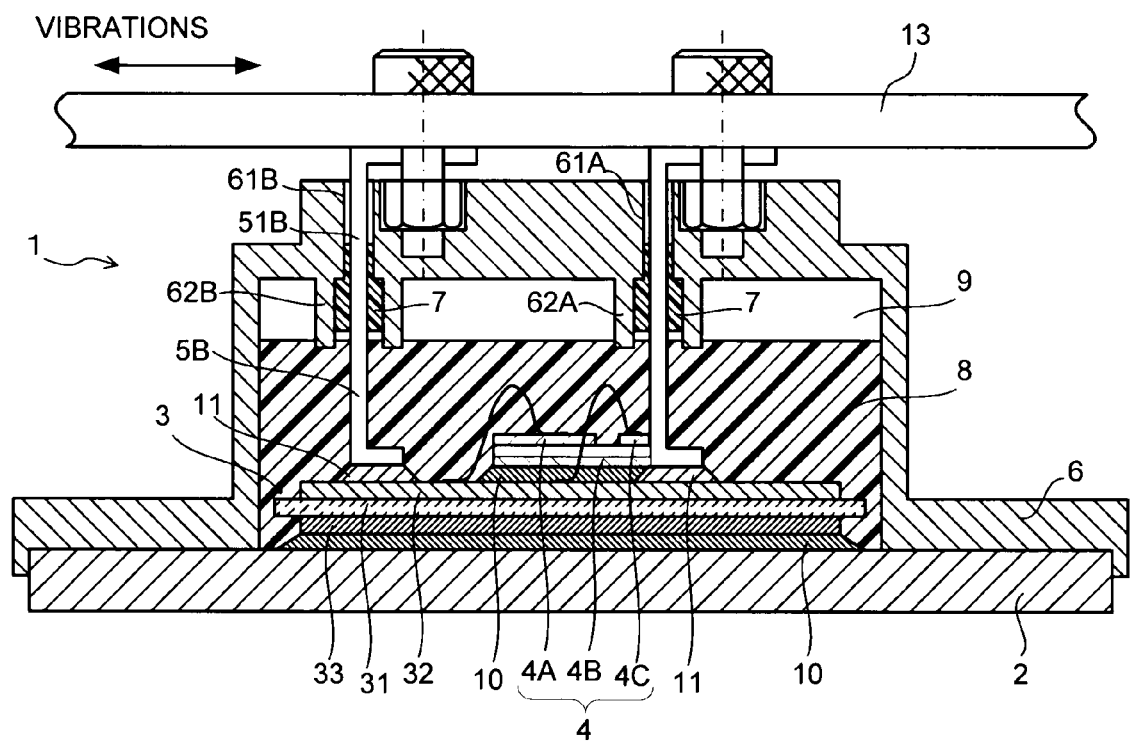
FIG. 4 is a cross-sectional view showing another structure that a bus bar is connected to the semiconductor device according to the first embodiment.

A gel-like resin layer 8 (e.g., a gel-like silicone resin layer) is formed on a lower section within the casing 6 so as to cover the joints 11 between the wiring board 3 and the first ends of the externally leading terminals 5A, 5B, 5C for gate, drain and source and the MOSFET 4. In this embodiment, the top surface of the gel-like resin layer 8 is contacted to the fixing resin 7, but the top surface of the gel-like resin layer 8 cannot be contacted to the fixing resin 7 as shown in FIG. 4. In addition, a space 9 is formed between the gel-like resin layer 8 and the inner top surface of the casing 6. The provision of the space 9 allows absorption of the thermal expansion of the gel-like resin layer 8, which is caused by heat generated from the MOSFET 4, by the space 9, and a tensile stress applied to the externally leading terminals 5A, 5B, 5C can be eased.

Figure 5:
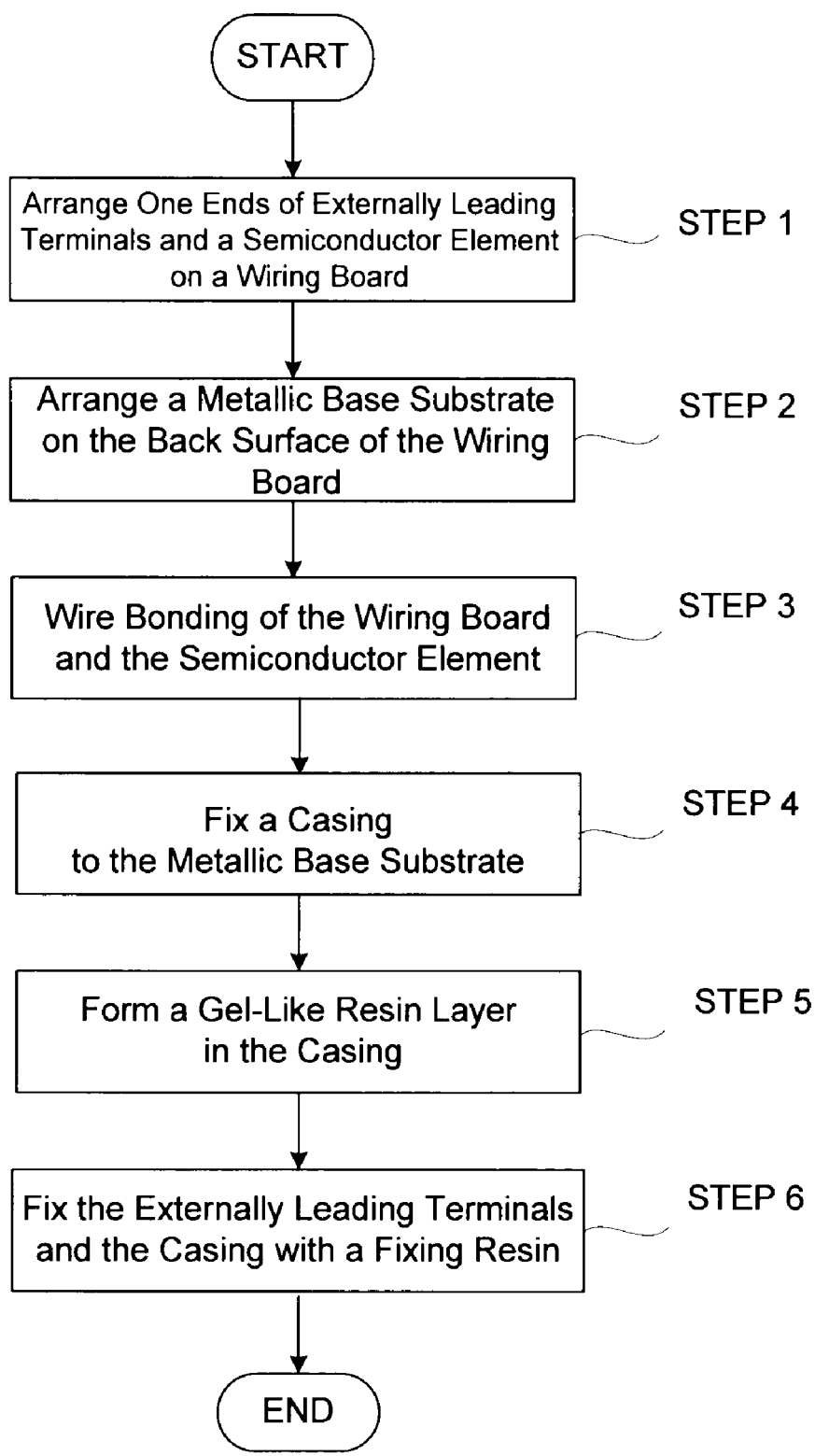
FIG. 5 is a flow chart showing a production process of the semiconductor device according to the first embodiment of the present invention.

For example, the above-described semiconductor device 1 of the first embodiment can be produced as follows. FIG. 5 is a flow chart showing a manufacturing process of the semiconductor device 1 according to the first embodiment.

First, the wiring board 3 having the wiring pattern 32, which is comprised of the gate wiring pattern 32A, the drain wiring pattern 32B and the source wiring pattern 32C, formed on the front surface of the ceramic substrate 31 and the metallic film 33 formed on the back surface is prepared. Then, the MOSFET 4 is arranged on the wiring board 3, and the drain electrode 4B of the MOSFET 4 is joined (bonded) to the drain wiring pattern 32B with the conductive bonding material 10 (step 1). The first end of the externally leading terminal 5A for gate is bonded to the gate wiring pattern 32A with the conductive bonding material. Similarly, the first end of the externally leading terminal 5B for drain is bonded to the drain wiring pattern 32B with the conductive bonding material, and the first end of the externally leading terminal 5C for source is bonded to the source wiring pattern 32C with the conductive bonding material. There are formed the joints 11, which are formed of the conductive bonding material, to join the first ends of the externally leading terminals 5A, 5B, 5C for gate, drain and source and the respective wiring patterns 32A, 32B, 32C for gate, drain and source.

The metallic base substrate 2 formed of a metallic material having good thermal conductivity is arranged on the metallic film 33, which is formed on the back surface of the wiring board 3, via the conductive bonding material 10 (e.g., a solder). And, the conductive bonding material 10 is fused by heating in a reflow furnace to fix the metallic base substrate 2 with the metallic film 33 of the wiring board 3 (step 2).

The gate wiring pattern 32A of the wiring board 3 and the gate electrode 4A of the MOSFET 4 are connected (wire bonded) through the bonding wire. The source wiring pattern 32C of the wiring board 3 and the source electrode 4C of the MOSFET 4 are also wire bonded in the same manner (step 3).

The casing 6 is placed to cover the wiring board 3 from above, and the terminal body portions 51A, 51B, 51C of the externally leading terminals 5A, 5B, 5C for gate, drain and source are inserted through the corresponding through hole portions 61A, 61B, 61C of the casing 6. And, the lower end of the casing 6 is fixed to the metallic base substrate 2 with an adhesive agent (step 4).

A gel-like resin (e.g., a gel-like silicone resin) is dispensed through a filling hole (not shown) formed in the casing 6 by a dispenser to fill the casing 6 (step 5). It is preferable to adjust the hardness (penetration) of the gel-like resin to a dispensable level. The filling hole is formed to fill the gel-like resin into the casing 6, and its arranged position, the number of holes and the size are not limited.

A filling amount of the gel-like resin is sufficient if it could cover the joints 11 between the first ends of the externally leading terminals 5A, 5B, 5C for gate, drain and source and the wiring board 3 and the MOSFET 4 and also form the space 9 between the gel-like resin and the inside top surface of the casing 6. Preferably, as shown in FIG. 1 and FIG. 3, it is an amount to contact the gel-like resin to the open lower ends of the cylindrical protruded portions 62A, 62B, 62C formed on the through hole portions 61A, 61B, 61C of the casing 6. When the filling amount is determined as described above, the open ends of the cylindrical protruded portions 62A, 62B, 62C of the casing 6 are closed by the top surface of the gel-like resin layer 8. Therefore, after the gel-like resin is thermally cured, the fixing resin 7 is contacted to the top surface of the gel-like resin layer 8 and accumulated in the cylindrical protruded portions 62A, 62B, 62C in a step (described later) of injecting the fixing resin 7 into the through hole portions 61A, 61B, 61C of the casing 6. Thus, the fixing resin 7 is prevented from sagging, and workability becomes good as a result. Besides, the contact between the fixing resin 7 and the gel-like resin layer 8 can effectively suppress vibrations from being transmitted from the bus bar 13 to the externally leading terminals 5A, 5B, 5C when the bus bar 13 is connected to the second ends of the externally leading terminals 5A, 5B, 5C for gate, drain and source. Therefore, a crack can be prevented more reliably from being produced in the joints 11 between the first ends of the externally leading terminals 5A, 5B, 5C for gate, drain and source and the wiring board 3.

After the gel-like resin is dispensed to fill, the gel-like resin is cured by heating (e.g., at 150 degrees C. for one hour) to form the gel-like resin layer 8.

Then, the fixing resin 7 (e.g., a thermosetting resin such as an epoxy resin, a silicone resin or the like) is injected into the through hole portions 61A, 61B, 61C for gate, drain and source of the casing 6 and cured by heating. When the fixing resin 7 is cooled to room temperature, there may be clearance (gap) between the fixing resin 7 and the gel-like resin layer 8. Thus, the terminal body portions 51A, 51B, 51C of the externally leading terminals 5A, 5B, 5C for gate, drain and source are respectively fixed to the through hole portions 61A, 61B, 61C of the casing 6 (step 6). As a result, the semiconductor device 1 of the first embodiment is obtained.

As described above, the terminal body portions 51A, 51B, 51C of the externally leading terminals 5A, 5B, 5C for gate, drain and source and the through hole portions 61A, 61B, 61C for gate, drain and source of the casing 6 are fixed with the fixing resin 7 in this embodiment. According to the above configuration, when the bus bar 13 is connected to the second ends of the externally leading terminals 5A, 5B, 5C for gate, drain and source which are externally protruded from the casing 6 at the time of using the semiconductor device 1, a crack doesn't occur easily in the joints 11 between the first ends of the externally leading terminals 5A, 5B, 5C and the wiring board 3 by vibrations transmitted from the bus bar 13 to the individual externally leading terminals 5A, 5B, 5C. Specifically, the fixing resin 7 is used to fix the externally leading terminals 5A, 5B, 5C and the through hole portions 61A, 61B, 61C of the casing 6 as described above, so that the service life of the semiconductor device 1 can be extended to about three times, namely to about 10 to 15 years. And, the electrical connection between the externally leading terminals 5A, 5B, 5C and the wiring board 3 is not inhibited, and the highly reliable semiconductor device 1 can be provided.

Besides, the gel-like resin layer 8 is formed to contact its top surface to the lower ends of the cylindrical protruded portions 62A, 62B, 62C of the through hole portions 61A, 61B, 61C of the casing 6, so that the fixing resin 7 can be formed at a prescribed position with good workability. In other words, when the liquid fixing resin 7 is injected through the through hole portions 61A, 61B, 61C of the casing 6, the fixing resin 7 is stopped from flowing down when it comes into contact with the top surface of the gel-like resin layer 8, and sagging is prevented. Thus, good workability can be obtained.

In this embodiment, the wiring board 3 and the metallic base substrate 2 are joined with the conductive bonding material 10 but may be joined by screwing. In this case, it can be configured to join the metallic base substrate 2 by forming threaded screw holes in the wiring board 3, cutting threads in the metallic base substrate 2, and joining them.

As an example of the semiconductor element, the structure using the vertical power MOSFET was described in this embodiment, but an IGBT (insulation gate bipolar transistor), a diode or a composite element combining such elements can also be used. The structure, shape, size and disposed relationships described in the embodiment are merely described roughly, and the numerals and the compositions (materials) of the individual structures are mere examples. Therefore, the present invention is not limited to the embodiment described above, and it is to be understood that modifications and variations of the embodiment can be made without departing from the spirit and scope of the invention.

What is claimed is:

1. A semiconductor device, comprising:
   a metallic base substrate;
   a wiring board arranged on the metallic base substrate;
   a semiconductor element arranged on the wiring board;
   externally leading terminals each having a first end arranged on the wiring board and electrically connected to the semiconductor element as a distal end, a second end arranged outside of the wiring board, and a main body portion which connects the first end and the second end;
   a housing including a through portion, through which the main body portion of the externally leading terminal is inserted, and is disposed on the metallic base substrate to cover the first end of the externally leading terminal and the semiconductor element, the through portion having a tubular protruded portion being open downwardly and a through hole, the inner diameter of the tubular protruded portion being larger than the diameter of the through hole;
   a fixing resin provided to fix the main body portion of the externally leading terminal to the through portion of the housing, the fixing resin being disposed within the tubular protruded portion and the hole; and
   a gel-like resin layer formed within the housing to cover the first end of the externally leading terminal and the semiconductor element and to have a space between the gel-like resin layer and the housing.

2. The semiconductor device according to claim 1, wherein the fixing resin is a thermosetting resin.

3. The semiconductor device according to claim 1, wherein the first end of the externally leading terminal and the wiring board are electrically connected with a conductive bonding material.

4. The semiconductor device according to claim 3, wherein the conductive bonding material is a solder.

5. The semiconductor device according to claim 1, wherein the semiconductor element is a vertical MOSFET.

6. The semiconductor device according to claim 1, further comprising:
   a bonding wiring provided to connect an electrode of the semiconductor element to a wiring pattern of the wiring board.

7. The semiconductor device according to claim 1, further comprising:
   a conductive bonding material provided to connect the metallic base substrate and the wiring board.

8. The semiconductor device according to claim 1, wherein the wiring board has a ceramic substrate and a wiring pattern on the ceramic substrate between the semiconductor element and the ceramic substrate.

9. The semiconductor device according to claim 1, further comprising:
   a metallic film having thermal conductivity, the metallic film being arranged between the metallic base substrate and the wiring board.

10. The semiconductor device according to claim 1, wherein a bus bar is connected to the second end of the externally leading terminal.

11. The semiconductor device according to claim 1, wherein the gel-like resin layer covers an end of the tubular protruded portion.

12. The semiconductor device according to claim 1, wherein a part of the gel-like resin layer is arranged between an inside wall of the tubular protruded portion and the main body portion of the externally leading terminal, the gel-like resin layer hermetically sealing an end of the tubular protruded portion at an opposite side of the through hole.

* * * * *